(12) United States Patent
Edmond et al.

(10) Patent No.: US 10,082,269 B2
(45) Date of Patent: Sep. 25, 2018

(54) LED LAMP

(71) Applicant: Cree, Inc., Durham, NC (US)

(72) Inventors: Mark Edmond, Raleigh, NC (US); Nishant Tiwari, Morrisville, NC (US)

(73) Assignee: Cree, Inc., Durham, NC (US)

( * ) Notice: Subject to any disclaimer, the term of this patent is extended or adjusted under 35 U.S.C. 154(b) by 199 days.

(21) Appl. No.: 14/733,241

(22) Filed: Jun. 8, 2015

(65) Prior Publication Data

US 2016/0356428 A1 Dec. 8, 2016

(51) Int. Cl.

| | |
|---|---|
| *F21K 99/00* | (2016.01) |
| *F21V 3/02* | (2006.01) |
| *F21V 19/00* | (2006.01) |
| *H05K 1/00* | (2006.01) |
| *F21K 9/69* | (2016.01) |
| *F21V 23/00* | (2015.01) |
| *F21K 9/238* | (2016.01) |
| *F21K 9/23* | (2016.01) |
| *F21V 29/83* | (2015.01) |
| *F21V 29/504* | (2015.01) |
| *F21V 29/506* | (2015.01) |
| *F21Y 105/10* | (2016.01) |
| *F21K 9/232* | (2016.01) |
| *F21Y 115/10* | (2016.01) |
| *F21K 9/235* | (2016.01) |
| *F21Y 107/90* | (2016.01) |

(52) U.S. Cl.
CPC ............. *F21V 3/02* (2013.01); *F21K 9/23* (2016.08); *F21K 9/238* (2016.08); *F21K 9/69* (2016.08); *F21V 19/003* (2013.01); *F21V 23/006* (2013.01); *H05K 1/00* (2013.01); *F21K 9/232* (2016.08); *F21K 9/235* (2016.08); *F21V 29/504* (2015.01); *F21V 29/506* (2015.01); *F21V 29/83* (2015.01); *F21Y 2105/10* (2016.08); *F21Y 2107/90* (2016.08); *F21Y 2115/10* (2016.08)

(58) Field of Classification Search
CPC .................................. F21K 9/232; F21K 9/68
USPC ... 362/79–103, 267, 294, 307–309, 317–361
See application file for complete search history.

(56) References Cited

U.S. PATENT DOCUMENTS

| 7,213,940 B1 | 5/2007 | Van De Ven et al. |
| 2004/0239242 A1* | 12/2004 | Mano ..................... F21K 9/232 313/512 |
| 2008/0232119 A1* | 9/2008 | Ribarich .............. H05K 1/0206 362/373 |

(Continued)

OTHER PUBLICATIONS

ENERGY STAR® Program Requirements for Integral LED Lamps, Mar. 22, 2010, pp. 1-30.

*Primary Examiner* — Zheng Song
(74) *Attorney, Agent, or Firm* — Dennis J. Williamson; Moore & Van Allen PLLC

(57) ABSTRACT

A lamp includes an optically transmissive enclosure and a base connected to the enclosure. A LED board is positioned in the enclosure and has a first side and a second side. A first LED array is mounted on the first side and a second LED array is mounted on the second side where the LED arrays are operable to emit light when energized through an electrical path from the base. A first diffusive lens and a second diffusive lens are located inside of and spaced from the enclosure. The first diffusive lens receives light emitted from the first LED array and the second diffusive lens receives light emitted from the second LED array.

17 Claims, 15 Drawing Sheets

(56) References Cited

U.S. PATENT DOCUMENTS

| | | | | |
|---|---|---|---|---|
| 2010/0164349 | A1* | 7/2010 | Kazmierski | F21V 13/04 313/111 |
| 2010/0207502 | A1* | 8/2010 | Cao | F21V 3/00 313/46 |
| 2010/0254133 | A1* | 10/2010 | Cheng | F21V 19/0055 362/235 |
| 2011/0051446 | A1* | 3/2011 | Saito | F21K 9/00 362/509 |
| 2011/0273102 | A1 | 11/2011 | Van De Ven et al. | |
| 2011/0298371 | A1* | 12/2011 | Brandes | F21V 23/005 315/32 |
| 2012/0182711 | A1* | 7/2012 | Kolodin | F21V 5/04 362/84 |
| 2012/0193647 | A1 | 8/2012 | Andrews | |
| 2012/0313518 | A1* | 12/2012 | Sun | F21K 9/90 315/32 |
| 2013/0026923 | A1 | 1/2013 | Athalye et al. | |
| 2013/0026925 | A1 | 1/2013 | Ven et al. | |
| 2013/0051003 | A1* | 2/2013 | Fan | F21V 3/02 362/231 |
| 2013/0058083 | A1* | 3/2013 | Cho | F21V 29/004 362/235 |
| 2013/0069535 | A1 | 3/2013 | Athalye | |
| 2013/0069547 | A1 | 3/2013 | Van De Ven et al. | |
| 2013/0293135 | A1 | 3/2013 | Athalye | |
| 2013/0127353 | A1 | 5/2013 | Athalye et al. | |
| 2013/0162149 | A1 | 6/2013 | Van De Ven et al. | |
| 2013/0162153 | A1 | 6/2013 | Van De Ven et al. | |
| 2013/0169159 | A1 | 7/2013 | Lys | |
| 2013/0182432 | A1* | 7/2013 | Yoo | F21K 9/20 362/235 |
| 2013/0194796 | A1* | 8/2013 | Progl | F21K 9/135 362/235 |
| 2013/0258657 | A1* | 10/2013 | Lin | F21V 5/048 362/235 |
| 2013/0258671 | A1* | 10/2013 | Baumann | F21V 29/02 362/293 |
| 2014/0078735 | A1* | 3/2014 | Premysler | F21V 29/508 362/237 |
| 2014/0306599 | A1* | 10/2014 | Edwards | F21V 3/02 313/502 |
| 2015/0176830 | A1* | 6/2015 | Liang | F21V 23/005 362/363 |
| 2016/0003417 | A1* | 1/2016 | Bukkems et al. | F21V 19/006 362/236 |
| 2016/0369993 | A1* | 12/2016 | Hikmet | F21V 29/506 |

\* cited by examiner

LED LAMP

BACKGROUND

Light emitting diode (LED) lighting systems are becoming more prevalent as replacements for legacy lighting systems. LED systems are an example of solid state lighting (SSL) and have advantages over traditional lighting solutions such as incandescent and fluorescent lighting because they use less energy, are more durable, operate longer, can be combined in multi-color arrays that can be controlled to deliver any color light, and generally contain no lead or mercury. A solid-state lighting system may take the form of a luminaire, lighting unit, light fixture, light bulb, or a "lamp."

An LED lighting system may include, for example, a packaged light emitting device including one or more light emitting diodes (LEDs), which may include inorganic LEDs, which may include semiconductor layers forming p-n junctions and/or organic LEDs, which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. LED lamps often include some type of optical element or elements to allow for localized mixing of colors, collimate light, or provide a particular light pattern. Sometimes the optical element also serves as an enclosure for the electronics and/or the LEDs in the lamp.

Since, ideally, an LED lamp designed as a replacement for a traditional incandescent or fluorescent light source needs to be self-contained; a power supply is included in the lamp structure along with the LEDs or LED packages and the optical components. A separate heat sink is also often needed to cool the LEDs and/or power supply in order to maintain appropriate operating temperature.

SUMMARY OF THE INVENTION

In some embodiments a lamp comprises an optically transmissive enclosure defining an interior space. A base is connected to the enclosure. A LED board is positioned in the interior space and defines a first side and a second side. A first LED is mounted on the first side and a second LED is mounted on the second side operable to emit light when energized through an electrical path from the base. A first diffusive lens and a second diffusive lens are located inside of and are spaced from the enclosure. The first diffusive lens receives light emitted from the first LED and the second diffusive lens receives light emitted from the second LED.

The LED board may be thermally dissipative. The LED board may be electrically conductive. The LED board may comprise a PCB FR4 board. The LED board may comprise a metal core printed circuit board. The LED board may form a part of the electrical path. The LED board may dissipate heat from the first LED and the second LED without a heat sink. The LED board may comprise an electrical circuit mounted on a substrate. The substrate may not be in the electrical path. The electrical circuit may comprise at least one of a flex circuit and a lead frame and the substrate may comprise at least one of glass and metal. The enclosure may comprise apertures that allow air to flow into, through and out of the enclosure. A first aperture may be provided proximate to the base and a second aperture may be provided proximate to a distal end of the lamp such that air may flow through the enclosure along a longitudinal axis of the lamp. The first diffusive lens and the second diffusive lens may comprise vent openings that allow air to flow into the space bounded by the first diffusive lens and the second diffusive lens. The LED board may comprise a planar rigid member. The first diffusive lens and the second diffusive lens may be mounted to the LED board. The first diffusive lens and the second diffusive lens may provide a diffuse scattering layer that produces a more uniform far field pattern. The first diffusive lens and the second diffusive lens may form part of a single lens assembly having a U-shaped support that is disposed over an edge of the LED board. The first diffusive lens and the second diffusive lens may be connected at a living hinge. The first diffusive lens and the second diffusive lens may be connected to the LED board by a snap-fit connection. The snap-fit connection may comprise a deformable male engagement member that engages a mating female engagement member.

In some embodiments a lamp comprises an optically transmissive enclosure defining an interior space and a base connected to the enclosure. A LED board is positioned in the interior space and a plurality of LEDs are mounted on the LED board and are operable to emit light when energized through an electrical path from the base. A diffusive lens is located inside of and spaced from the enclosure, the diffusive lens receives light emitted from the plurality of LEDs. The optically transmissive enclosure may have a first end connected to the base and a second end to define a longitudinal axis extending from the base toward the second end where the LED board may extend parallel to the longitudinal axis.

DETAILED DESCRIPTION

Figure 1:
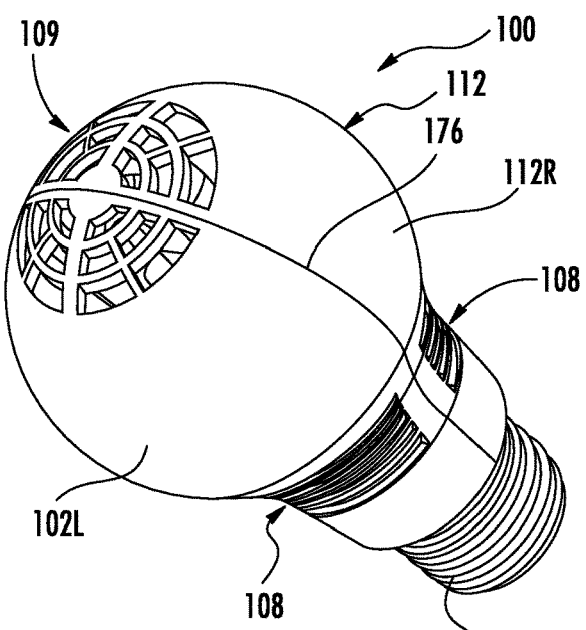
FIG. 1 is a perspective view of an embodiment of a lamp of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output having a color temperature range of from about 2200K to about 6000K.

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

It should also be noted that the term "lamp" is meant to encompass not only a solid-state replacement for a traditional incandescent bulb as illustrated herein, but also replacements for fluorescent bulbs, replacements for complete fixtures, and any type of light fixture that may be custom designed as a solid state fixture.

Figure 2:
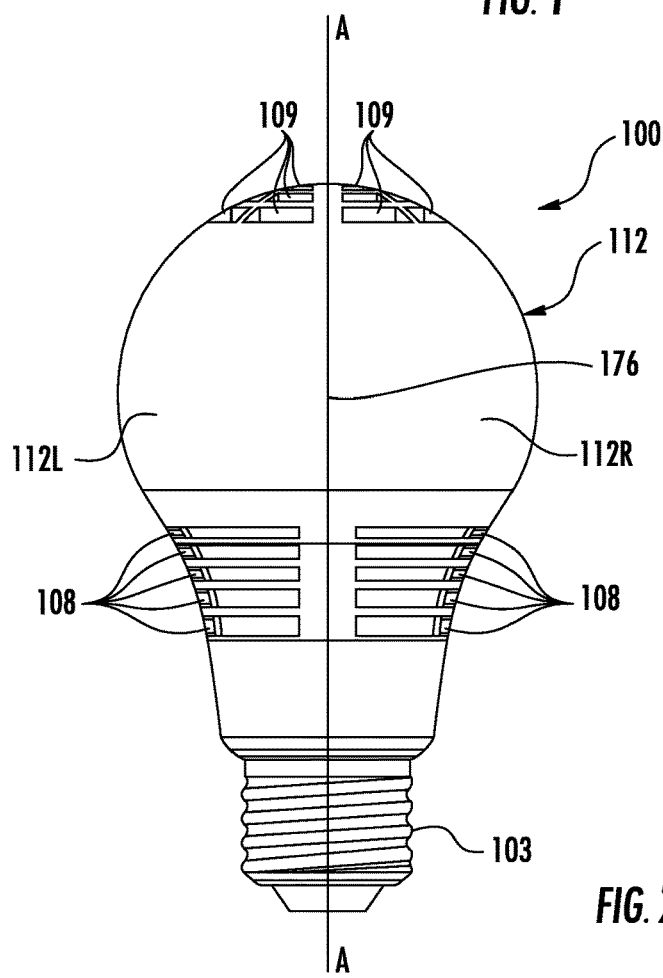
FIG. 2 is a plan view of the lamp of FIG. 1.

FIGS. 1 and 2 show a lamp, 100, according to some embodiments of the present invention embodied in a form factor of a traditional incandescent bulb. In an omnidirectional lamp such as lamp 100 the light is emitted in a wide omnidirectional pattern. In one embodiment, the enclosure 112 and base 103 are dimensioned to be a replacement for an ANSI standard A series bulb such that the dimensions of the lamp 100 fall within the ANSI standards for an A series bulb. In one embodiment, the lamp 100 is configured to be a replacement for an ANSI standard A19 bulb such that the dimensions of the lamp 100 fall within the ANSI standards for an A19 bulb. The dimensions may be different for other ANSI standards including, but not limited to, A21 and A23 standards. The lamp of the invention may be embodied in different forms including standard and non-standard form factors. In other embodiments, the LED lamp can have any shape, including standard and non-standard shapes. In the lamp 100, light is emitted from the lamp in an omnidirectional pattern and in one embodiment the lamp may comply with "ENERGY STAR® Program Requirements for Integral LED Lamps". The lamp may be equivalent to a 40W, 60W, 75W or 100W bulb or it may be equivalent to other wattages.

Lamp 100 may comprise an electrically conductive base 103. A lamp base, such as the illustrated Edison base 103, functions as the electrical connector to connect the lamp 100 to an electrical socket or other power source. Depending on the embodiment, other base configurations are possible to make the electrical connection such as other standard bases or non-standard bases. The base 103 comprises an electrically conductive Edison screw for connecting to an Edison socket. A LED assembly 130 may be contained in the optically transmissive enclosure 112 through which light emitted by the LEDs is transmitted to the exterior of the lamp. In the illustrated embodiment, the enclosure 112 may be entirely or almost entirely optically transmissive where the entire enclosure 112 defines the exit surface through which light is emitted from the lamp. The enclosure 112 may be made of glass, quartz, borosilicate, silicate, polycarbonate, ABS, other plastic or other suitable material or combinations of such materials. The enclosure 112 may be of similar shape to that commonly used in standard A series bulbs. In some embodiments, the interior surface of the enclosure 112 may be coated with silica, providing a diffuse scattering layer that produces a more uniform far field pattern. The enclosure 112 may also be etched, frosted or otherwise coated to provide the diffuser. In other embodiments the enclosure may be made of a material such as plastic such as polycarbonate, ABS plastic or the like where the diffuser is created by the material of the enclosure and/or by mixtures of the material with additives. The enclosure 112 may also be provided with a shatter proof or shatter resistant coating especially where the enclosure is made of a breakable material such as glass. It should also be noted that in this or any of the embodiments shown here, the optically transmissive enclosure 112 or a portion of the optically transmissive enclosure could be coated or impregnated with phosphor.

In some embodiments the enclosure 112 may be provided with vent openings or apertures 108, 109 such that the interior of the lamp is in communication with the exterior of the lamp. The vent openings 108, 109 allow air to flow into, through and out of the enclosure 112 such that the air cools the LED assembly 130 inside of the enclosure. In one embodiment an aperture or apertures 108 are provided proximate to the base 103 and another aperture or apertures 109 are provided proximate to the distal end of the lamp such that air may flow through the enclosure 112 along the longitudinal axis of the lamp to create a chimney effect for dissipating heat to the ambient environment. In the illustrated embodiment a plurality of apertures 108 and 109 are provided that are formed as relatively narrow elongated slots.

The enclosure 112 and the Edison screw 103 define an internal cavity 107 for receiving the electronics 110 of the lamp including the power supply and/or drivers or a portion of the electronics for the lamp. The lamp electronics 110 are electrically coupled to the electrically conductive base 103 such that the electrical connection may be made from the base 103 to the lamp electronics 110. The lamp electronics may be mounted on a printed circuit board which includes the power supply, including large capacitor and EMI components that are across the input AC line along with the driver circuitry as described herein. The electronics may be potted to protect and isolate the lamp electronics 110.

Suitable power supplies and drivers are described in U.S. patent application Ser. No. 13/462,388 filed on May 2, 2012 and titled "Driver Circuits for Dimmable Solid State Lighting Apparatus" which is incorporated herein by reference in its entirety; U.S. patent application Ser. No. 12/775,842 filed on May 7, 2010 and titled "AC Driven Solid State Lighting Apparatus with LED String Including Switched Segments" which is incorporated herein by reference in its entirety; U.S. patent application Ser. No. 13/192,755 filed Jul. 28, 2011 titled "Solid State Lighting Apparatus and Methods of Using Integrated Driver Circuitry" which is incorporated herein by reference in its entirety; U.S. patent application Ser. No. 13/339,974 filed Dec. 29, 2011 titled "Solid-State Lighting Apparatus and Methods Using Parallel-Connected Segment Bypass Circuits" which is incorporated herein by reference in its entirety; U.S. patent application Ser. No. 13/235,103 filed Sep. 16, 2011 titled "Solid-State Lighting Apparatus and Methods Using Energy Storage" which is incorporated herein by reference in its entirety; U.S. patent application Ser. No. 13/360,145 filed Jan. 27, 2012 titled "Solid State Lighting Apparatus and Methods of Forming" which is incorporated herein by reference in its entirety; U.S. patent application Ser. No. 13/338,095 filed Dec. 27, 2011 titled "Solid-State Lighting Apparatus Including an Energy Storage Module for Applying Power to a Light Source Element During Low Power Intervals and Methods of Operating the Same" which is incorporated herein by reference in its entirety; U.S. patent application Ser. No. 13/338,076 filed Dec. 27, 2011 titled "Solid-State Lighting Apparatus Including Current Diversion Controlled by Lighting Device Bias States and Current Limiting Using a Passive Electrical Component" which is incorporated herein by reference in its entirety; and U.S. patent application Ser. No. 13/405,891 filed Feb. 27, 2012 titled "Solid-State Lighting Apparatus and Methods Using Energy Storage" which is incorporated herein by reference in its entirety.

The AC to DC conversion may be provided by a boost topology to minimize losses and therefore maximize conversion efficiency. The boost supply is connected to high voltage LEDs operating at greater than 200V. Examples of boost topologies are described in U.S. patent application Ser. No. 13/462,388, entitled "Driver Circuits for Dimmable Solid State Lighting Apparatus", filed on May 2, 2012 which is incorporated by reference herein in its entirety; and U.S. patent application Ser. No. 13/662,618, entitled "Driving Circuits for Solid-State Lighting Apparatus with High Voltage LED Components and Related Methods", filed on Oct. 29, 2012 which is incorporated by reference herein in its entirety. Other embodiments are possible using different driver configurations or a boost supply at lower voltages.

The term "electrical path" can be used to refer to the entire electrical path to the LED's 127, including an intervening power supply disposed between the electrical connection that would otherwise provide power directly to the LEDs and the LED array, or it may be used to refer to the connection between the mains and all the electronics in the lamp, including the power supply. The term may also be used to refer to the connection between the power supply and the LEDs. Electrical conductors run between the LEDs 127 and the lamp base 103 to carry both sides of the supply to provide critical current to the LEDs 127 as will be described.

The LED assembly 130 may be implemented using a printed circuit board ("PCB") or other similar component which may be referred to as an LED board 129 and a plurality of LEDs 127. The lamp 100 is a solid-state lamp comprising a plurality of LEDs 127. Multiple LEDs 127 can be used together, forming an LED array 128. The LEDs 127 can be mounted on or fixed within the lamp in various ways. The LEDs 127 in the LED array 128 include LEDs which may comprise an LED die or a plurality of LED dies disposed in an encapsulant such as silicone, and LEDs which may be encapsulated with a phosphor to provide local wavelength conversion. A wide variety of LEDs and combinations of LEDs may be used in the LED assembly 130 as described herein. The LEDs 127 of the LED array 128 are operable to emit light when energized through the electrical path. The LED board 129 may comprise a series of anodes and cathodes arranged in pairs for connection to the LEDs 127. An LED 127 containing at least one LED or LED package is secured to each anode and cathode pair where the LED spans the anode and cathode. The LEDs 127 may be attached to the LED board 129 by soldering. In one embodiment, an LED array 128 comprising LEDs 127 is disposed on both sides 129a, 129b of a planar LED board 129 such that light is emitted from both sides of the LED board 129. The LEDs 127 may have a relatively wide angle light distribution pattern such that light is emitted from the LED array 128 in a relatively wide beam angle such as 180 degrees in a three-dimensional field. While specific embodiments of LEDs are described herein, a greater or fewer number of anode/cathode pairs and LEDs may be used and the specific placement of the LEDs on LED board 129 may vary from that shown.

LEDs 127 used with embodiments of the invention can include light emitting diode chips that emit hues of light that, when mixed, are perceived in combination as white light. Phosphors can be used as described to add yet other colors of light by wavelength conversion. For example, blue or violet LEDs can be used in the LED assembly of the lamp and the appropriate phosphor can be in any of the ways mentioned above. LED devices can be used with phosphorized coatings packaged locally with the LEDs or with a phosphor coating the LED die as previously described. For example, blue-shifted yellow (BSY) LED devices, which typically include a local phosphor, can be used with a red phosphor on or in the optically transmissive enclosure or inner envelope to create substantially white light, or combined with red emitting LED devices in the array to create substantially white light.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices include a group of LEDs, wherein each LED, if and when illuminated, emits light having dominant wavelength from 440 to 480 nm. The LED devices include another group of LEDs, wherein each LED, if and when illuminated, emits light having a dominant wavelength from 605 to 630 nm. A phosphor can be used that, when excited, emits light having a dominant wavelength from 560 to 580 nm, so as to form a blue-shifted-yellow light with light from the former LED devices. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially while light can be found in issued U.S. Pat. No. 7,213,940, which is incorporated herein by reference.

Figure 9:
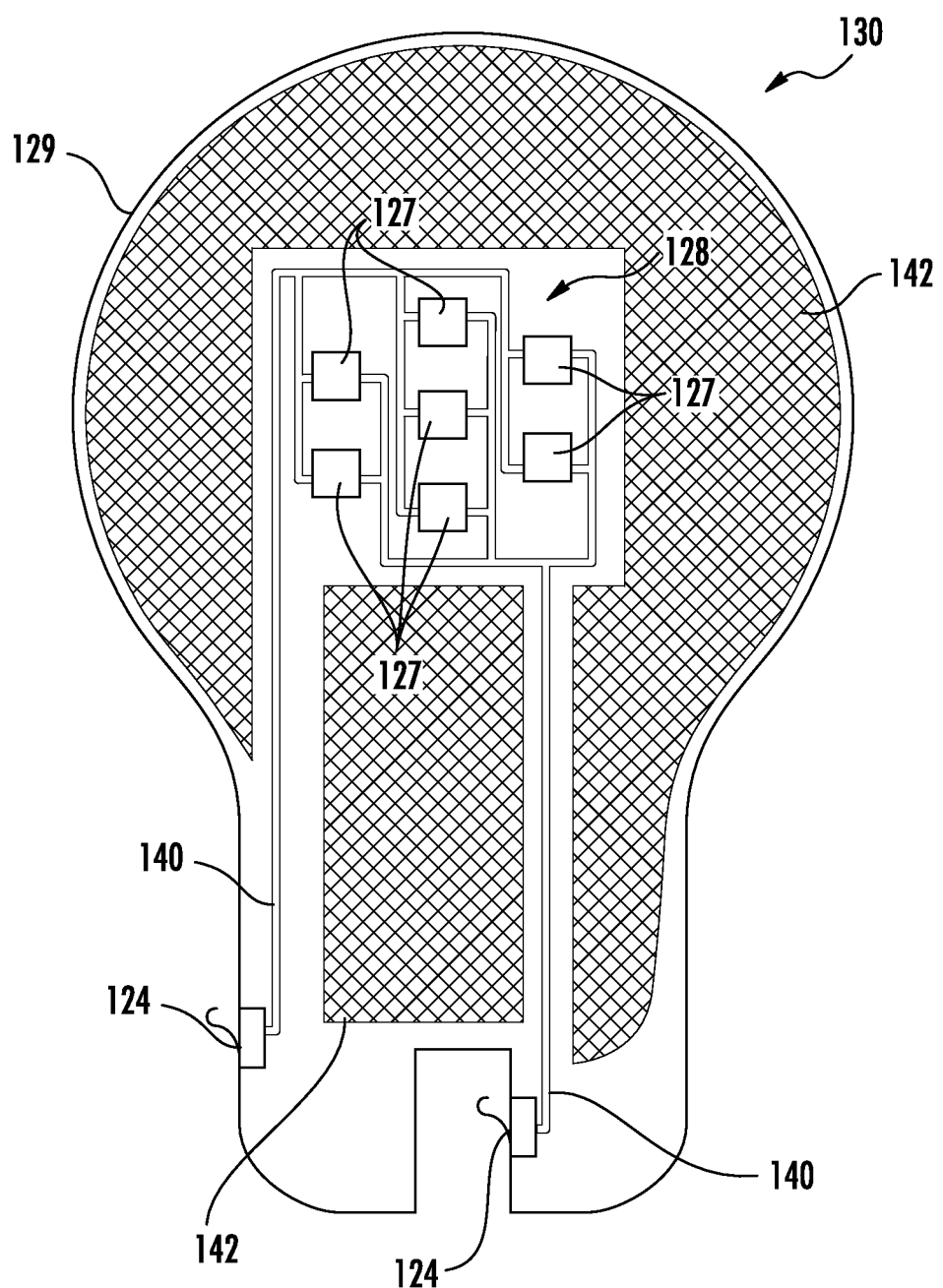
FIGS. 9 through 12 are plan views of various embodiments of the LED assembly usable in the lamp of the invention.
Figure 10:
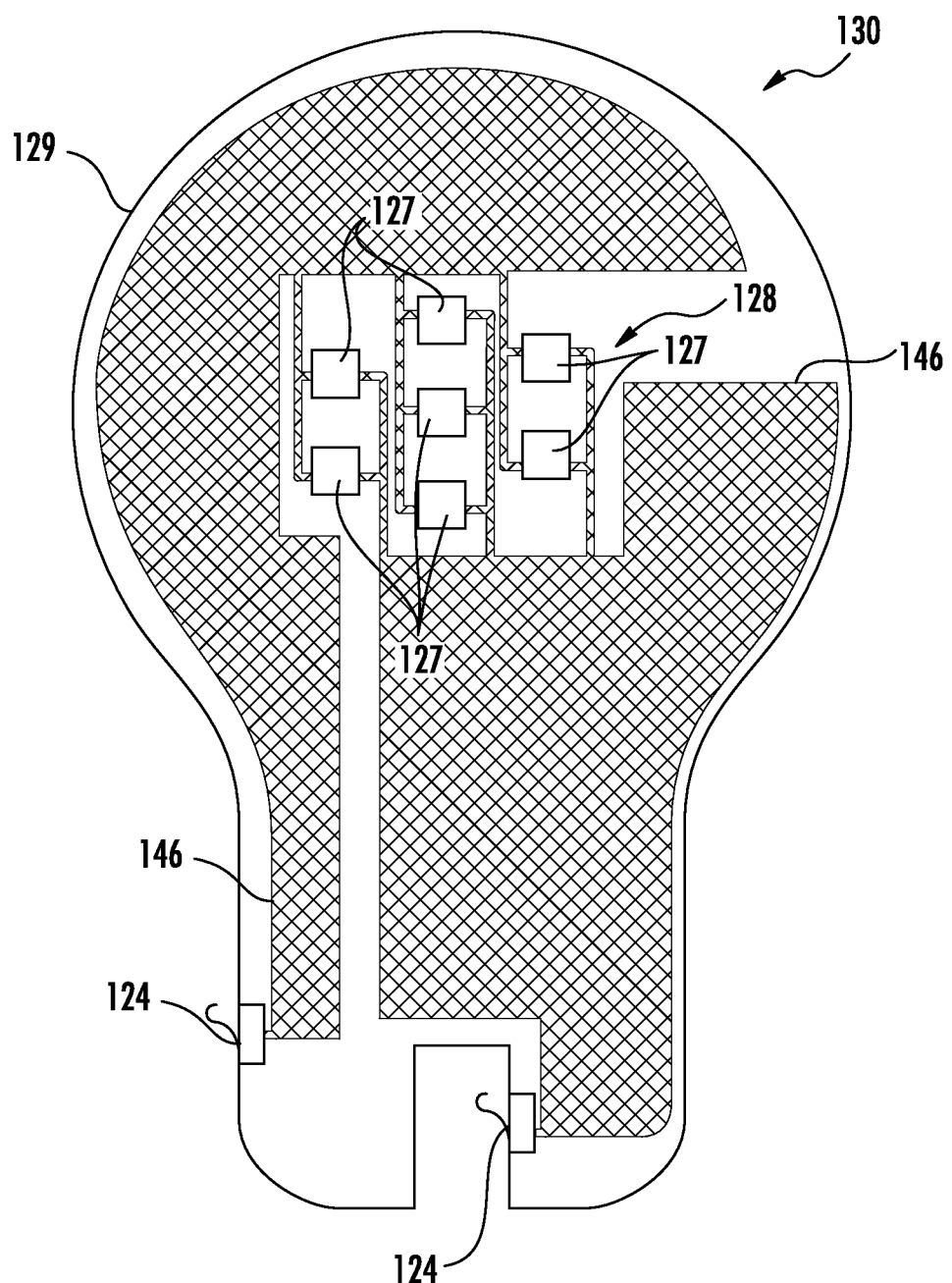

In some embodiments, the LED board 129 may comprise a PCB, such as FR4 board, a metal core printed circuit board (MCPCB), or other similar structure. The LED board 129 comprises a thermally conductive material supported on a dielectric material or other electrically insulating material or materials. The thermally conductive area may be formed as part of the electrical path connecting the LEDs 127 to the lamp electronics 110 and to the base 103. In some embodiments a large area of the LED board 129 may be thermally conductive such that a large area of the entire LED assembly 130 acts as a heat dissipative element to transfer heat to the air in the enclosure 112. It will be appreciated that in a typical PCB the electrical connections may be formed as metal traces or conductors where the traces or conductors are made relatively small so as to cover as small of an area of the PCB as possible and still provide electrical connections to the components on the PCB. In the lamp of the invention the LED board 129 may be provided with thermally conductive material such as copper, aluminum or the like where the amount of metal or other thermally conductive material used is sufficient to conduct heat away from the LEDs 127 and dissipate the heat to the surrounding air during steady state operation of the lamp. The copper, aluminum, other metal or other thermally conductive material on the LED board 129 may form part of the electrical path to the LEDs 127. In some embodiments the electrically and thermally conductive material may form relatively small traces as is commonly done with PCBs but additional thermally conductive material may cover a relatively large area of the LED board 129 as a component separate from the electrically conductive traces that form the electrical path to the LEDs if the LEDs require additional thermal dissipation. If the LEDs 127 require additional thermal dissipation, additional metal may be used in the LED board 129 for the electrical connections to the LED assembly or additional heat sinking may be used. FIG. 9 shows an embodiment of a LED assembly 130 where the electrically conductive traces or conductors 140 on LED board 129, that form part of the electrical path from the base 103 and lamp electronics 110 to the LEDs 127, are separate components from metal areas 142 (shaded areas) that do not form part of the electrical path and function to dissipate heat from the LEDs. In the actual device these areas may not be visible and may be covered by electrically insulating and/or light reflective material. The conductors 140 may connect to the lamp electronics 110 and terminate in spring contacts 124 for connection to the base 103. In the embodiment of the LED assembly 130 shown in FIG. 10, the conductors 146 on LED board 129 that form the electrical path from the base 103 and the lamp electronics 110 to the LEDs 127 are formed as relatively large areas such that these areas function both to provide current to the LEDs 127 and to dissipate heat from the LEDs. In this embodiment the electrical conductors 146 are intentionally formed as larger areas than would ordinarily be the case if the conductors only functioned to provide current to the LEDs.

In some embodiments, the LED board 129 may comprise a PCB, such as FR4 board. In an FR4 PCB the FR4 provides a glass epoxy insulating substrate. A layer of conductive material such as copper may be laminated to one, or both sides of the FR4 substrate. The FR4 copper-clad sheets comprise circuitry etched into copper layers to produce printed circuit boards. FR4 printed circuit boards may be produced in multiple layers. In some embodiments, the LED board 129 may comprise a MCPCB that comprises a thermally and electrically conductive core made of aluminum or other similar pliable metal material. The core is covered by a dielectric material such as polyimide. Metal core boards allow traces to be formed therein. Other structurally rigid structures for the LED board 129 may also be used. In embodiments using a LED board such as FR4 or MCPCB, the LED board has structural rigidity such that the board physically supports the LEDs 127 in position in the lamp and forms part of the electrical path to the LEDs 127.

Figure 11:
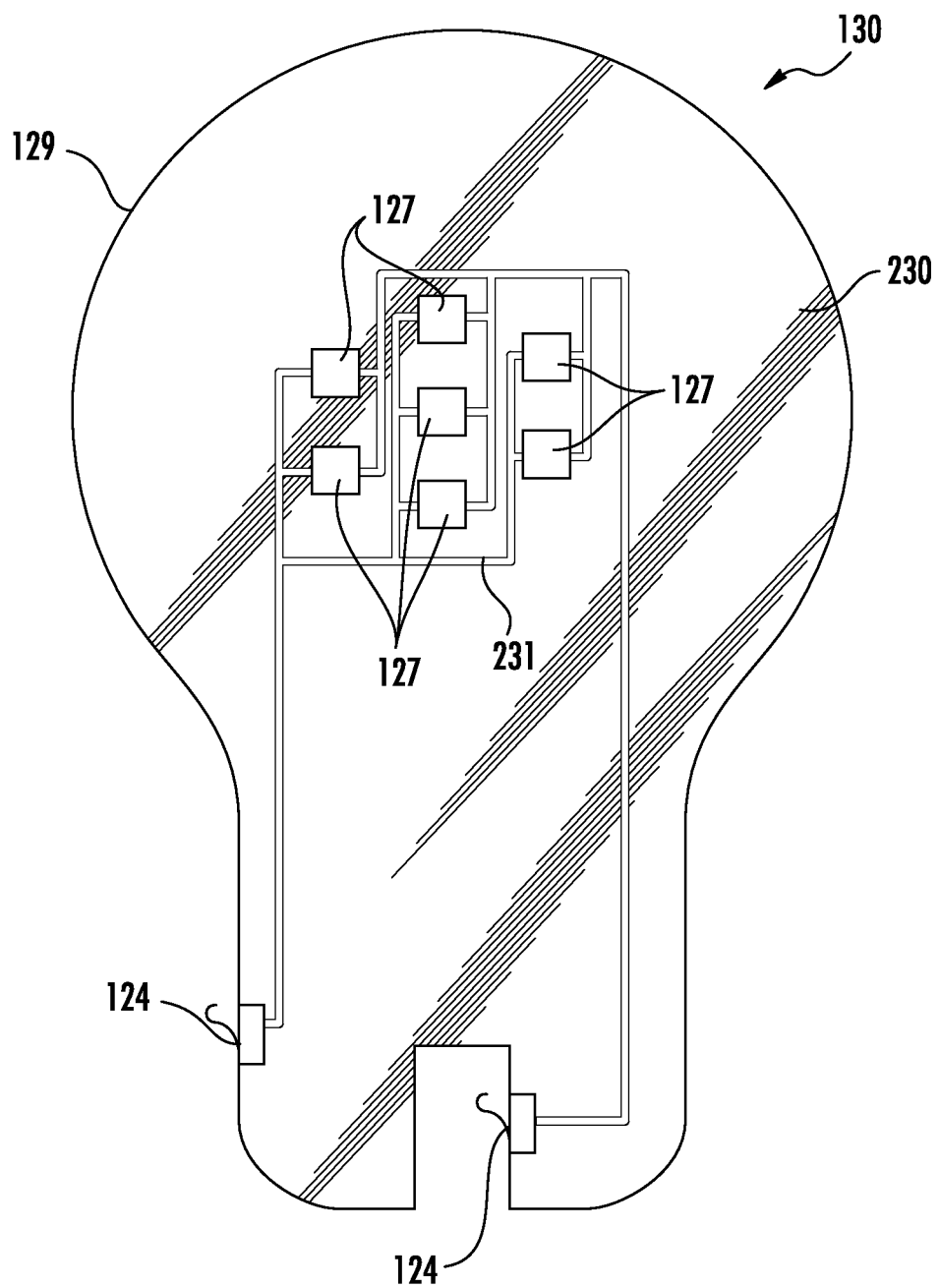
Figure 12:
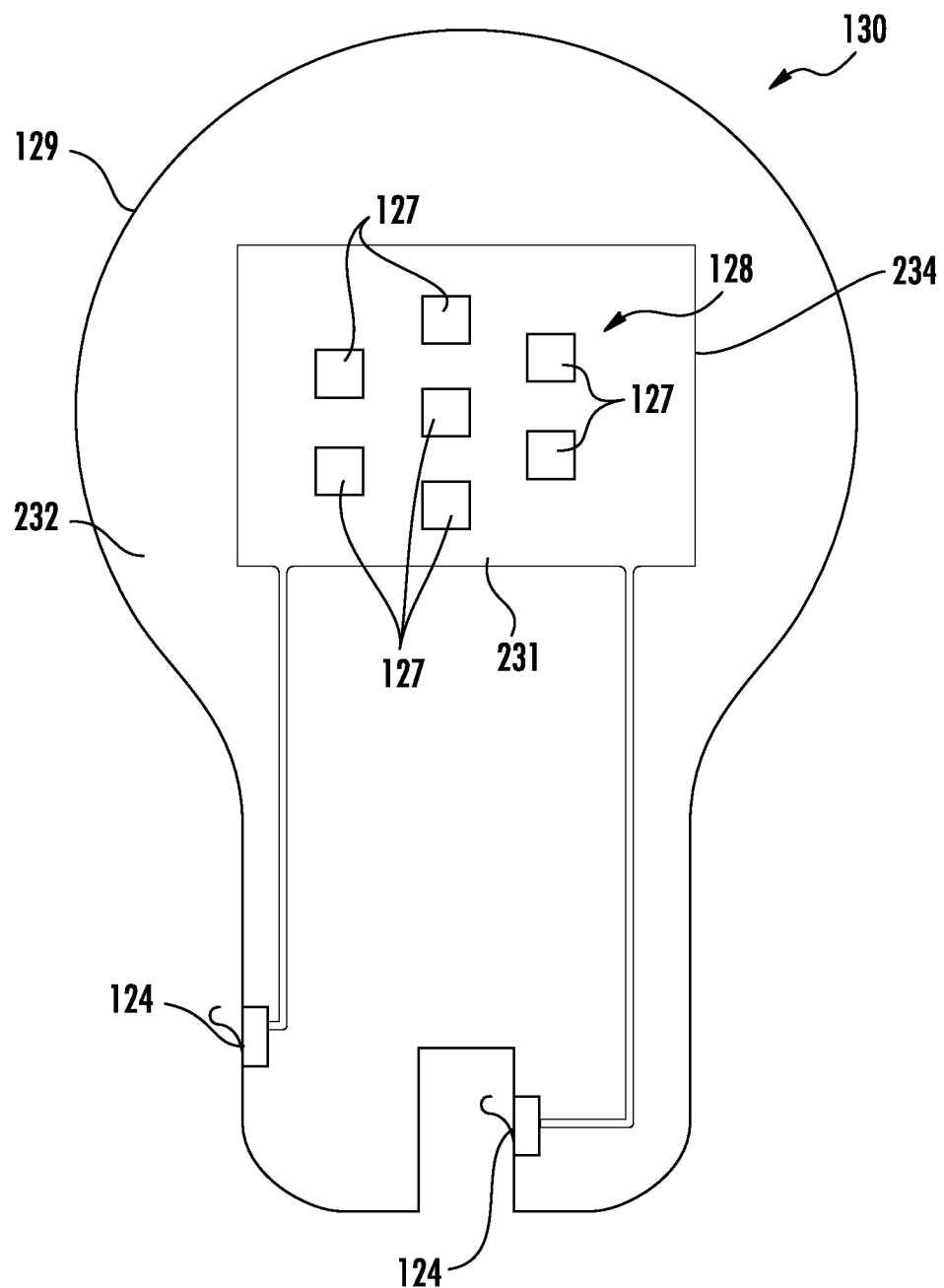

In some embodiments the LED board may comprise a hybrid structure where a rigid substrate physically supports the LEDs 127 in position in the lamp and where the electrical connections to the lamp may be made with a separate electrically conductive component. In some embodiments the electrical connections may be made using a flex circuit comprising a flexible layer of a dielectric material such as a plastic, polymeric, polyimide, polyester or other material to which a layer of copper or other electrically and thermally conductive material is applied such as by adhesive. Electrical traces are formed in the conductive layer of the electrically conductive material to form electrical pads for mounting the electrical components such as LEDs 127 and other lamp electronics 110 to the LED board and for creating the electrical path between the components. The conductive layer may be covered by a protective layer or layers. In other embodiments, a lead frame may be used to provide the electrical path to the LEDs 127 and may be made of an electrically conductive material such as copper, copper alloy, aluminum, steel, gold, silver, alloys of such metals, thermally conductive plastic or the like. Other electrical circuits may be used with the rigid substrate. The boards may be a single member or multiple members joined together. While in one embodiment the board may be a relatively thin planar member the board may have relatively wider or narrower portions.

Where the electrical connections are made using a device such as a flex circuit, lead frame, wires or the like that do not have sufficient structural rigidity to adequately support the LEDs in position in the lamp, the electrical circuitry may be mounted on a structurally rigid substrate. For example, referring to FIG. 11 the LED board 129 may comprise a substrate 230 made of a structurally rigid material, for example transparent glass or metal, having circuitry 231 applied to the surface of the substrate 230 such that the electrical connections to the LEDs 127 are provided by the circuitry 231. The circuitry 231 may comprise a lead frame or other conductive component that may be supported by substrate 230. Heat dissipation may be accomplished by adding additional heat conducting material to the substrate 230 as described with respect to FIGS. 9 and 10. In another embodiment, shown in FIG. 12, the LED board 129 comprises a substrate 232 such as transparent glass or metal, for example steel or aluminum, where a flex circuit 234 is mounted on the substrate 232 for providing the electrical path to the LEDs 127. The substrate 232 may comprise a thermally transmissive material to dissipate heat from the LEDs 127. In these and in other embodiments, the metal layers of the circuitry and/or the supporting layers may be made of a sufficient area to increase the heat dissipative properties of the lamp as previously described. Moreover, while specific combinations have been described the various components may he arranged in various combinations. For example, the flex circuit, lead frame or other electrical circuitry may be mounted on any of the substrates described herein or on any other suitable substrate. For example, the supporting substrate may comprise a PCB, graphene and/or plastic.

Figure 3:
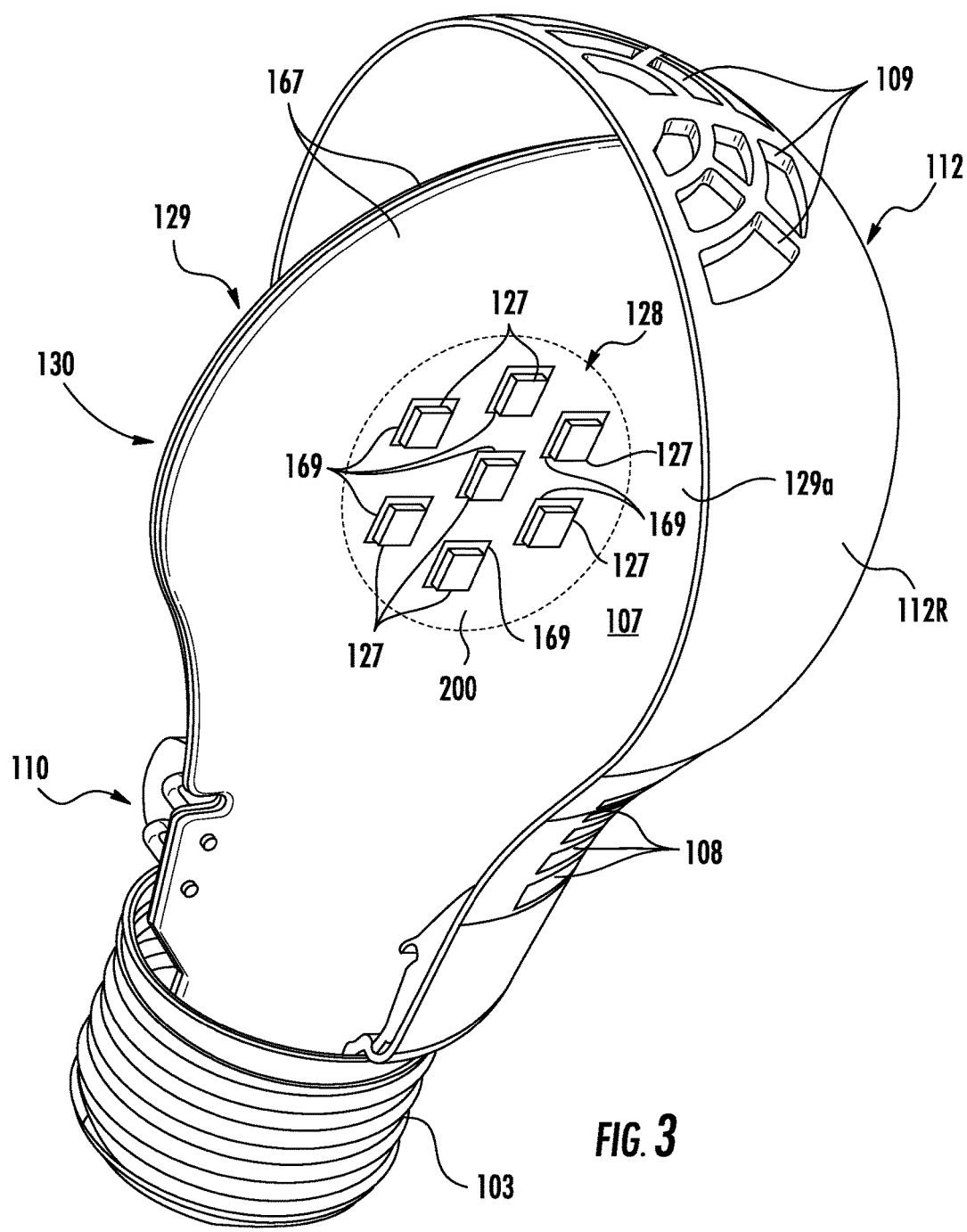
FIG. 3 is a perspective view the lamp of FIG. 1 with a part of the enclosure removed.

In one embodiment, the exposed surfaces of the LED assembly 130 may be made of or covered by a reflective surface, refractive optic surface, spreading surface and/or diffuse reflective surface 167, shown in FIG. 3, to reflect light inside of enclosure 112 during operation of the lamp. The surface 167 may be a diffuse reflector and may be made of a white highly reflective material such as injection molded plastic, white optics, PET, MCPET, or other reflective material. Using a diffuse reflector the reflected light is reflected at many angles where an ideal diffuse reflector has equal luminance in all directions. A diffuse reflector scatters light to provide a uniform distribution of light. In some embodiments the surface 167 may be a specular reflector material such as injection molded plastic or die cast metal (aluminum, zinc, magnesium) with a specular coating. A reflective coating may also be applied via vacuum metallization or sputtering, and could be aluminum or silver. Using a specular reflector the reflected light is effectively reflected as a mirror of the source. The reflective surface may also be a formed film, formed aluminum, or the like. The reflective surface may also include a transparent matrix loaded with a high index material such as a silicone with TiO2 particles. One such suitable reflective material is shown and described in US Patent Application Pub. No. 2012/0193647, entitled "Solid State Lighting Component Package with Reflective Layer" by Andrews, having a Pub. Date of Aug. 2, 2012, which is incorporated by reference herein in its entirety. The entire LED assembly 130, other than the LEDs 127, may be made of or covered in the reflective surface, refractive optic surface, spreading surface and/or diffuse reflective surface 167 or portions of the LED assembly 130 may be made of or covered in the reflective surface, refractive optic surface, spreading surface and/or diffuse reflective surface 167. For example, portions of the LED assembly 130 that reflect light may be made of or covered in reflective surface, refractive optic surface, spreading surface and/or diffuse reflective surface 167 while the remainder of the LED assembly 130 may comprise other materials including non-reflective materials. The reflective surface 167 may be applied to the LED boards 129 with "cutouts" 169 provided to expose the LEDs 127. In some embodiments the LED boards 129 may reflect a portion of the light and allow a portion of the light to pass through the LED board. For example, a glass substrate, as previously described with respect to FIG. 11, may allow some light to pass through the substrate and may reflect some of the light. As used herein a "reflective surface" means a surface that reflects at least a portion of the light from a light source whether the reflection is diffuse, Specular, spread or combinations of such reflections and includes surfaces that have refractive optical properties in addition to reflective properties.

The LEDs 127 may be arranged such that the LEDs are substantially in the center of the enclosure 112. As used herein the terms "center of the enclosure" refers to the vertical position of the LEDs in the enclosure as being aligned with the approximate largest diameter area of the globe shaped main body 114. "Vertical" as used herein means along the longitudinal axis of the bulb where the longitudinal axis extends from the base 103 to the free end of the bulb as represented for example by line A-A in FIG. 2. In one embodiment, the LEDs are arranged in the approximate location that the visible glowing filament is disposed in a standard incandescent bulb. The term "center of the enclosure" does not necessarily mean the exact center of the enclosure and is used to signify that the LEDs are located along the longitudinal axis of the lamp at a position between the ends of the enclosure near a central portion of the enclosure. Other patterns for the LEDs 127 are possible in addition to those shown and described herein.

Figure 4:
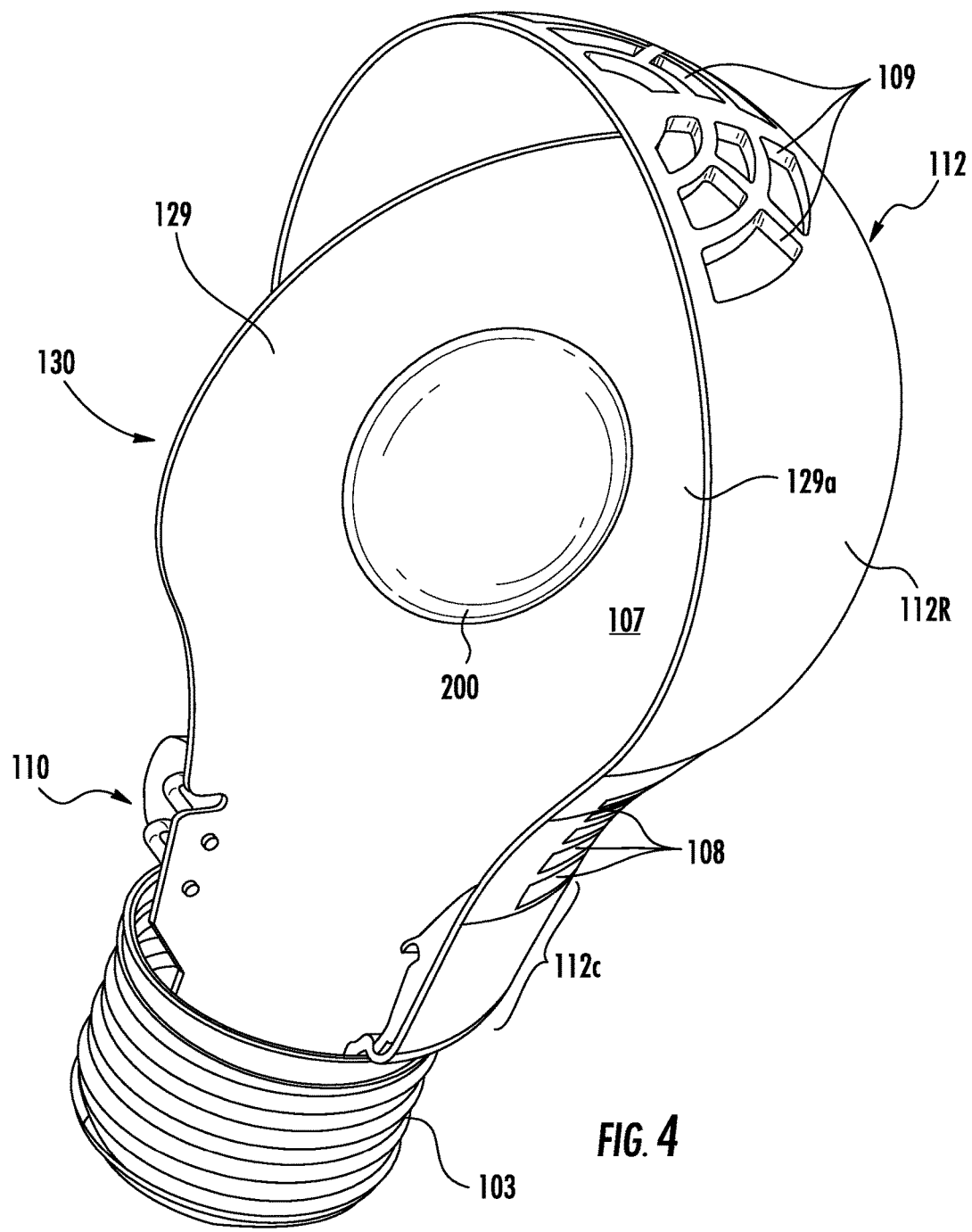
FIG. 4 is a perspective view the lamp of FIG. 1 with a part of the enclosure removed.
Figure 8:
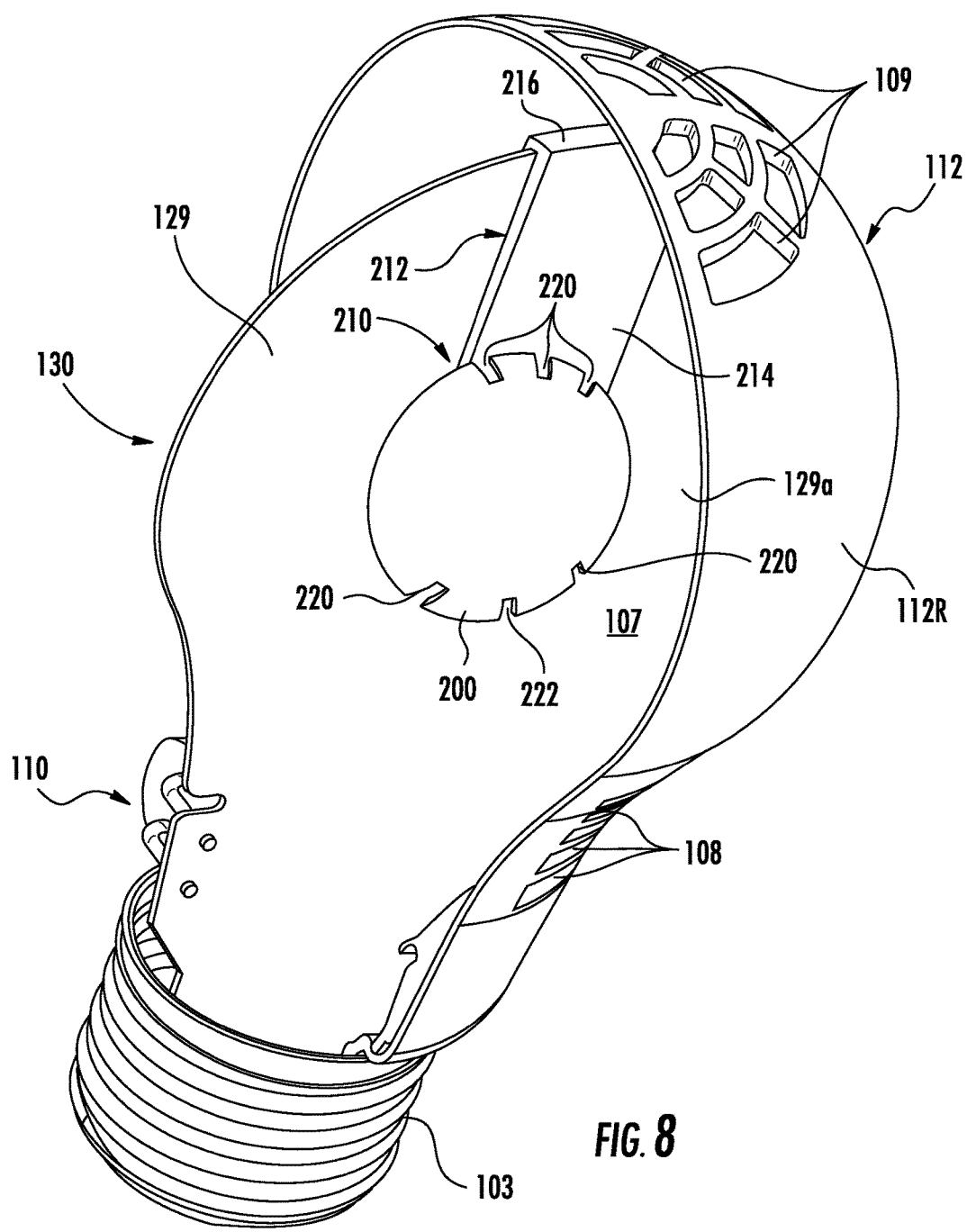
FIG. 8 is a perspective view the lamp of FIG. 6 with a part of the enclosure removed.

The LED board 129 may be shaped and dimensioned such that it extends close to or abuts the interior surface of the enclosure 112 as shown in FIGS. 3, 4 and 8. In other embodiments, as shown for example in FIG. 15, the LED board 129 may not follow the shape of the enclosure 112 such that the edges of the LED board 129 may be spaced from the interior surface of the enclosure 112. In such an embodiment the LED board 129 may have a wide variety of shapes and configurations.

In one embodiment each LED board 129 comprises a rigid substrate that physically supports the LEDs 127 and includes electrical conductors that provide the electrical path to the LEDs 127 and a thermally conductive portion such as a metal layer that functions to dissipate heat as previously described. As previously explained, the LED boards 129 may be provided with a metal layer beyond what is required to make the electrical connections to the LEDs 127 in order to increase the heat dissipating properties of the LED boards. The metal layer may be covered by a dielectric or insulating material on both sides and the dielectric or insulating material may comprise reflective material or it may be covered in a reflective material. Each LED board 129 may also be comprised of more than one PCB board arranged back to back to create the LED boards 129. The LEDs 127 may be soldered to conductive pads formed by the conductive layer in desired positions on the LED boards 129.

Figure 14:
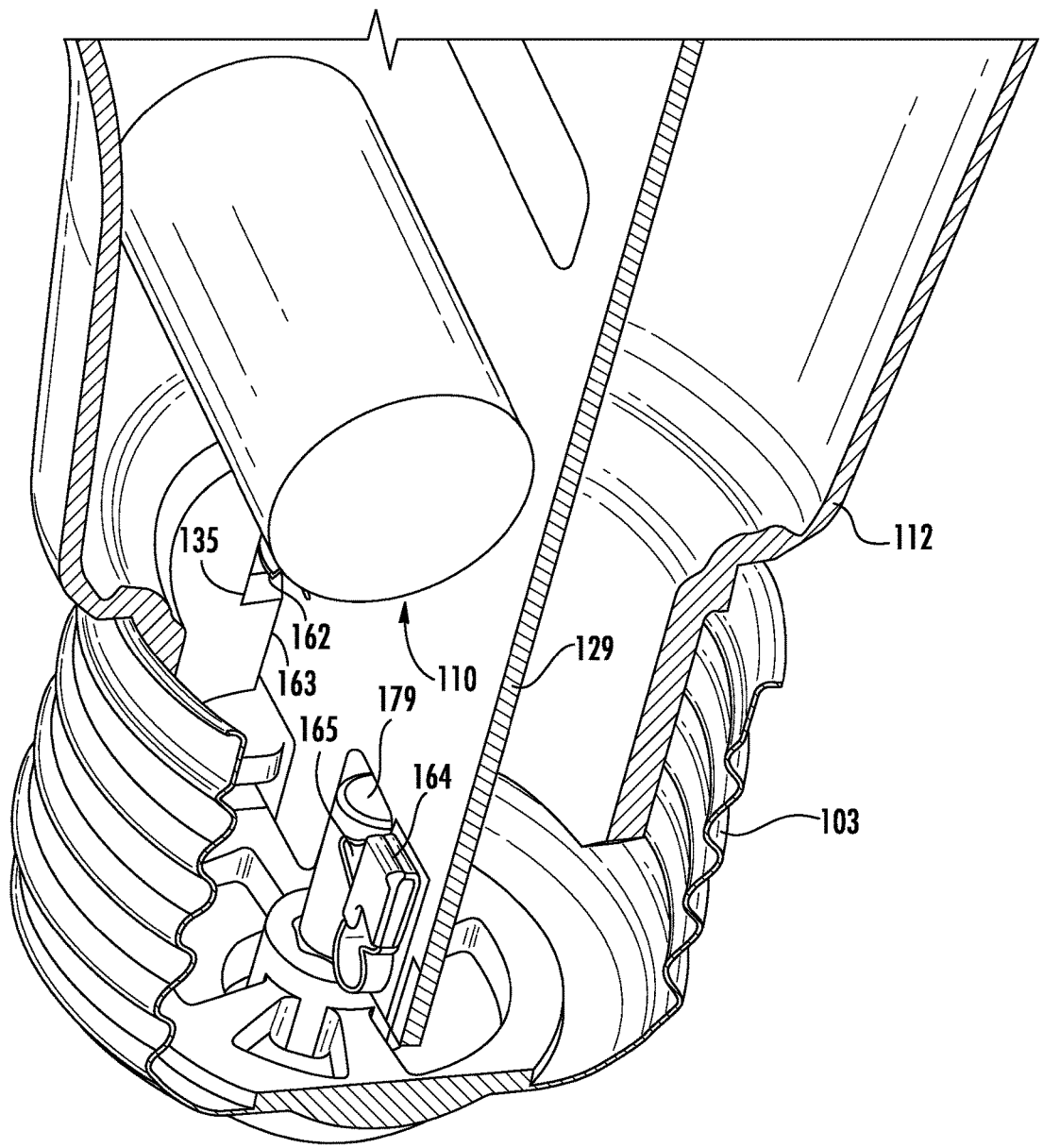

In some embodiments the LED board 129 may be supported by the base 102 and/or enclosure 112 at its lower edges. For example, the base 102 and/or enclosure 112 may include receptacles such as opposed channels 163 (one of which is shown in FIG. 14) that engage the lower end of the LED board 129 such that the board is connected to and supported by the base 102 and/or enclosure 112 Other connection mechanisms such as adhesive mechanical connectors, snap-fit connectors may be used in various combinations.

In some embodiments the enclosure may be formed of two parts such as a left part 112L and a right part 112R that connect along a longitudinal seam 176 (FIGS. 1 and 2). The LED assembly 130 may be located in a first part of the enclosure and the second part of the enclosure may be attached to the first part to trap the LED assembly in the enclosure 112. The enclosure parts may be secured together by any suitable connection mechanism such as adhesive, mechanical fasteners, welding or the like.

The LED board 129 may be used to mount the lamp electronics 110 in the lamp. The LED board 129 may be shaped to extend into the base 103. The lamp electronics 110 may be mounted directly on the end of the LED board 129 such that a separate PCB board is not required for the lamp electronics. Traces or other circuitry may be provided on the LED boards 129 to connect the base 103 to the lamp electronics 110. While a separate PCB is not required, the lamp electronics 110 may be mounted on a separate lamp electronics PCB and the lamps electronics PCB may be connected to the circuitry on the LED boards 129 by separate electrical conductors.

Figure 13:
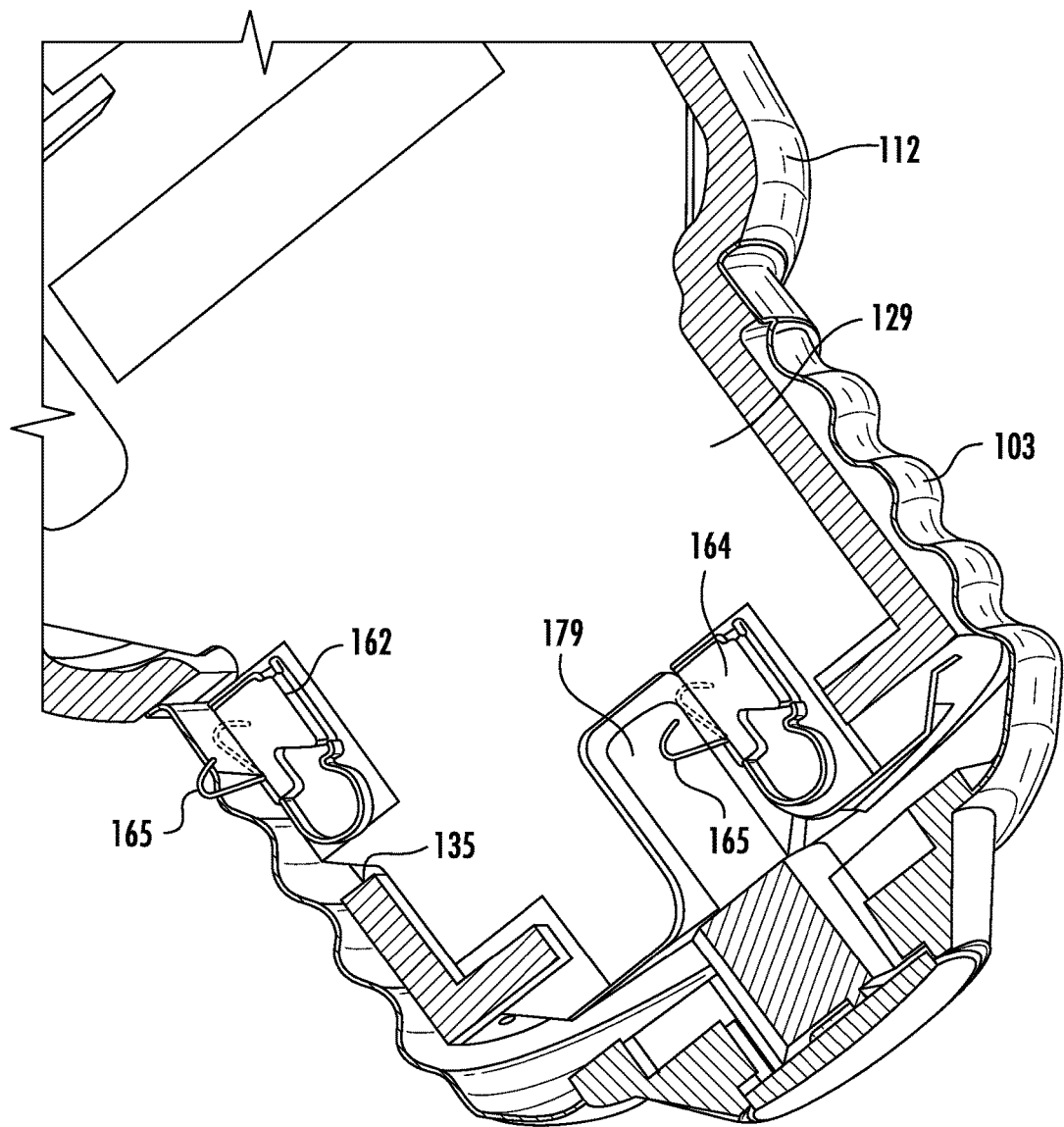
FIGS. 13 and 14 are partial section views of an embodiment of the lamp of the invention.

To provide the electrical connection from the lamp base 103 to the LEDs 127 soldered and/or wired connections may be used between the conductive base 103 and the lamp electronics 110. In other embodiments spring contacts may be used such that the electrical connection between the base 103 and the LED board 129 may be made without soldering or wires. Referring to FIGS. 13 and 14 the LED board 129 may comprise a first spring contact 162 that is electrically coupled to one of the anode or cathode side of the lamp electronics 110 and a second spring contact 164 that is electrically coupled to the other one of the anode or cathode side of the lamp electronics 110. The first spring contact 162 and the second spring contact 164 are arranged such that the contacts extend from the LED board 129. The spring contacts are configured such that they create an electrical connection to the anode side and the cathode side of the Edison screw 103. Where an Edison screw base 103 is used one spring contact 162 creates a contact coupling with the inside surface of the base 103 and the other spring contact 164 creates a contact coupling with the centerline contact 179. In the illustrated embodiment a cutout 135 is provided in the enclosure 112 through which the spring contact 162 extends to make contact with the base 103. The contacts 162, 164 comprise resilient conductors 165 such that the conductors 165 are deformed (from the solid line position to the dashed line position as shown in FIG. 13) when the LED board 129 is inserted into the base 102 to ensure a good electrical contact with the base. The engagement between the spring contacts 162, 164 and the base 102 is a contact coupling where the electrical coupling is created by the contact under pressure between the contacts and the base 102 as distinguished from a soldered coupling and does not require separate wires or soldering.

While the electrical connection has been described with reference to an Edison base, the electrical connection as described herein may be used with any style of base, such as, but not limited to, single contact bayonet connectors, double contact bayonet connectors, pin connectors, wedge connectors or the like, where the spring contacts are configured to contact the electrical contacts of the base. It will be appreciated that the spring contacts and/or LED board 129 may be configured to conform to the shape, size and configuration of the base. Moreover, a greater or fewer number of contacts may be provided depending upon the configuration of the lamp electronics and/or the base contacts.

Because the LED board 129 is provided with a relatively large area of thermally conductive metal such as copper or aluminum the LED boards can dissipate heat from the LEDs without requiring a separate heat sink structure. However, a separate heat sink structure may be used in addition to the LED boards 129. While a separate heat sink 170 may be used, in one preferred embodiment the cost and complexity associated with a separate heat sink may be eliminated by using the LED boards without a heat sink to dissipate heat from the LEDs as previously described.

Figure 15:
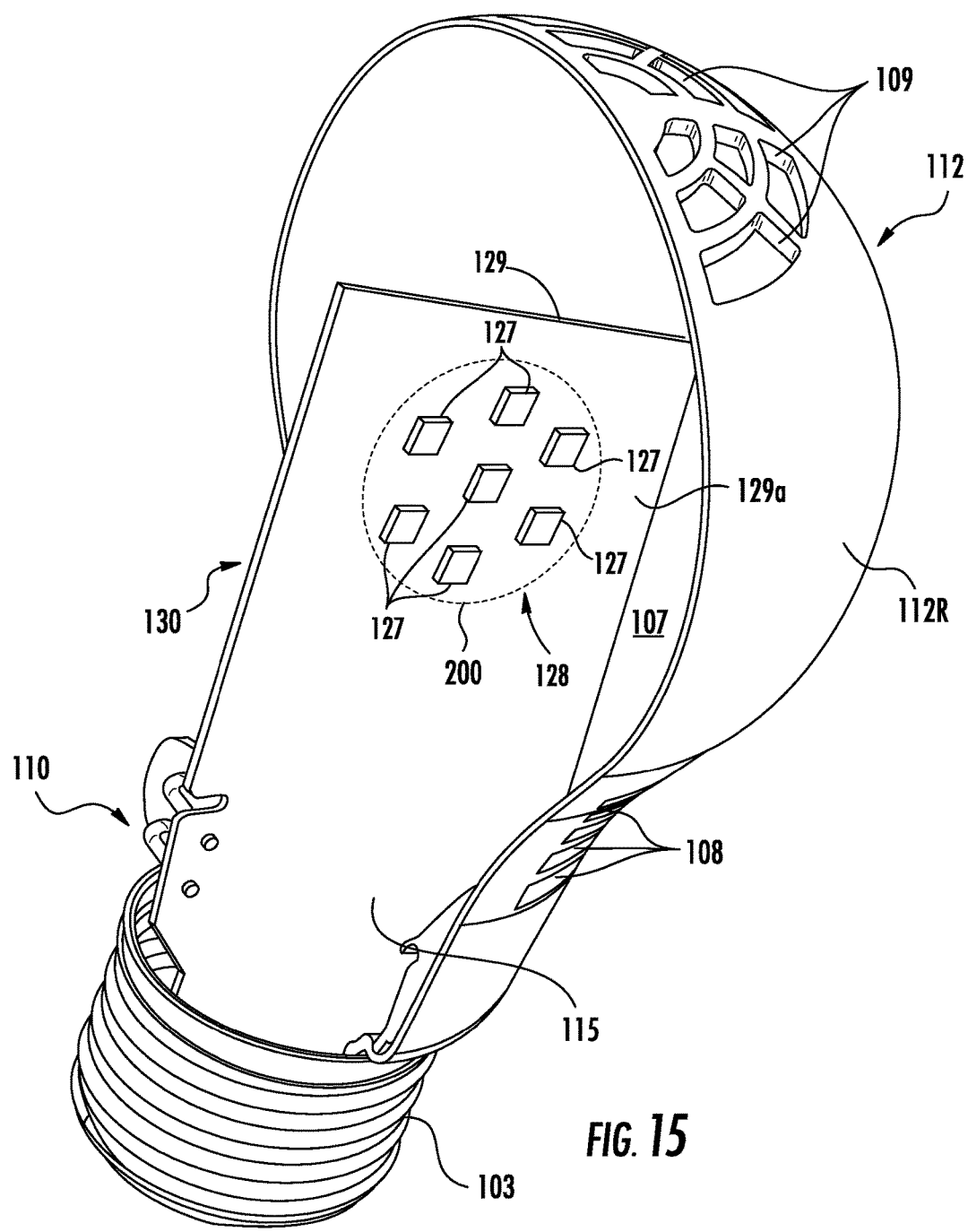
FIG. 15 is a perspective view the lamp of another embodiment of the lamp with a part of the enclosure removed.

A separate diffusive element or lens 200 is provided with each LED array 128. In FIGS. 3 and 15 the diffuser element or lens 200 is represented by dashed lines in order to show the LEDs 127. In actual use the lens 200 has a light diffusive surface such that the LEDs may not be visible through the lens 200 as illustrated for example in FIGS. 4 and 8. A lens 200 may be mounted to the LED board 129 over each of the LED arrays 128 such that light emitted from the LEDs 127 is mixed and diffused by the lens 200. The lens 200 may be made of glass, quartz, borosilicate, silicate, polycarbonate, other plastic or other suitable material. In some embodiments, the exit surface of the lens 200 may be coated on the inside with silica, providing a diffuse scattering layer that produces a more uniform far field pattern. The lens 200 may also be etched, frosted or coated to provide the diffuser. In other embodiments the lens 200 may be made of a material such as polycarbonate or ABS plastic where the diffuser is created by the material of the lens. The lens 200 may be coated or impregnated with phosphor.

The lens 200 provides a first layer of diffusion of the light emitted by the LEDs 127 such that the light exiting the lens 200 has been mixed and diffused by the lens 200. The lens 200 is shaped such that the light exiting the lens is substantially omnidirectional over 180 degrees in a three-dimensional field. The two LED arrays 128 and the two lenses 200 create a light emission pattern hat is substantially omnidirectional. In one embodiment the lens 200 may have a dome shape or semi-spherical shape. However, other lens shapes may be used such as conical a truncated cone or truncated dome or semisphere or faceted provided the lens 200 diffuses the light emitted by the LEDs 127 and generates a generally omnidirectional pattern. While the light is described as generally omnidirectional the light pattern emitted by the lenses 200 may be other than strictly omnidirectional provided that the light emitted by the lamp may be considered omnidirectional such as to meet the requirements for "ENERGY STAR® Program Requirements for Integral LED Lamps".

The diffused light emitted by lens 200 strikes the enclosure 112 where the light is diffused a second time by the diffusive enclosure. The diffusive enclosure 112 diffuses the light a second time to create an uniform omnidirectional field. The use of an internal diffusive lens 200 over each LED array 128 that is spaced from and located inside of a second diffusive enclosure 112 has been found to create an omnidirectional light pattern that complies with the "ENERGY STAR® Program Requirements for Integral LED Lamps" while allowing the LEDs 127 to be mounted on opposite sides of a longitudinally extending, planar LED board.

Figure 5:
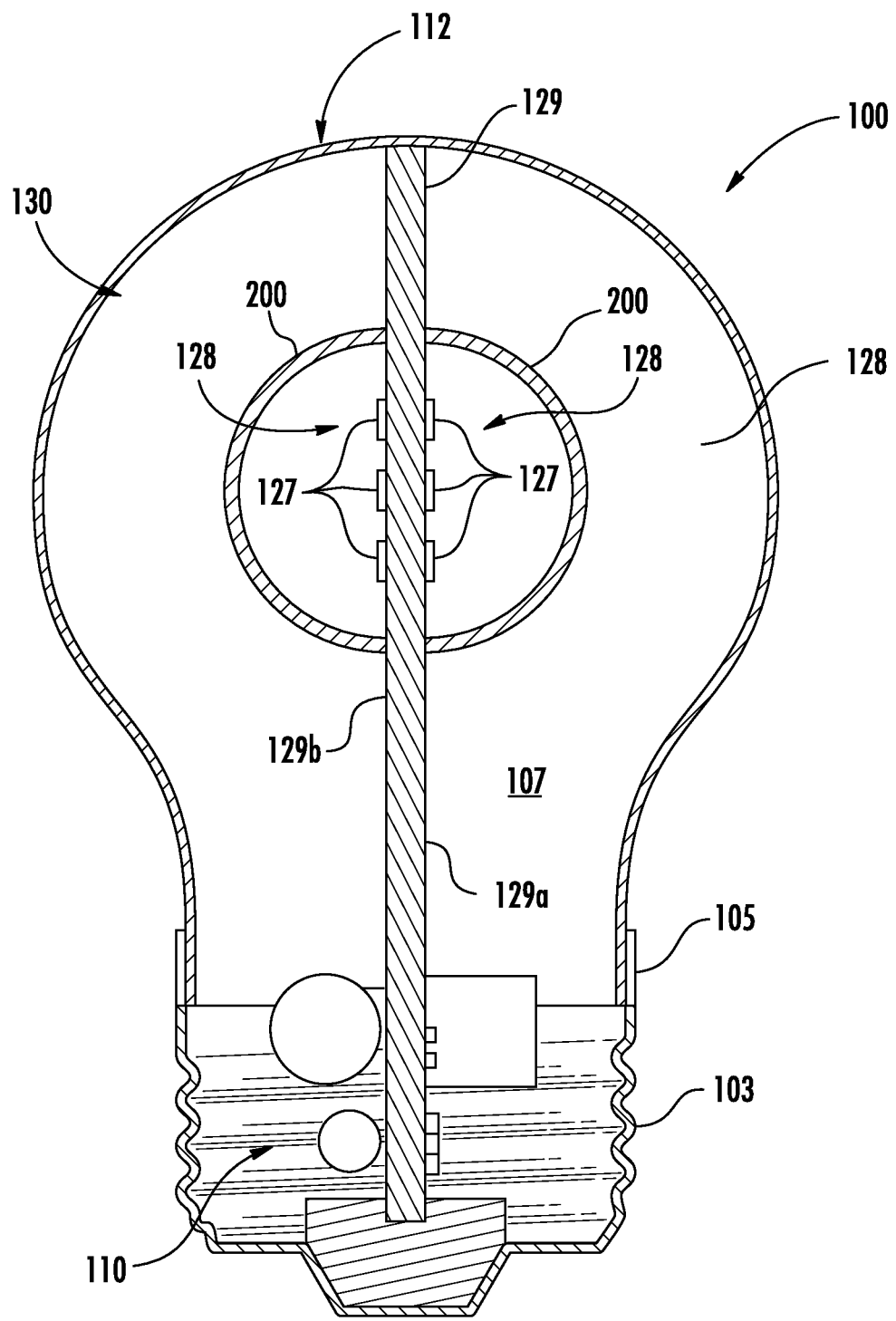
FIG. 5 is a section view of an embodiment of the lamp of the invention.
Figure 6:
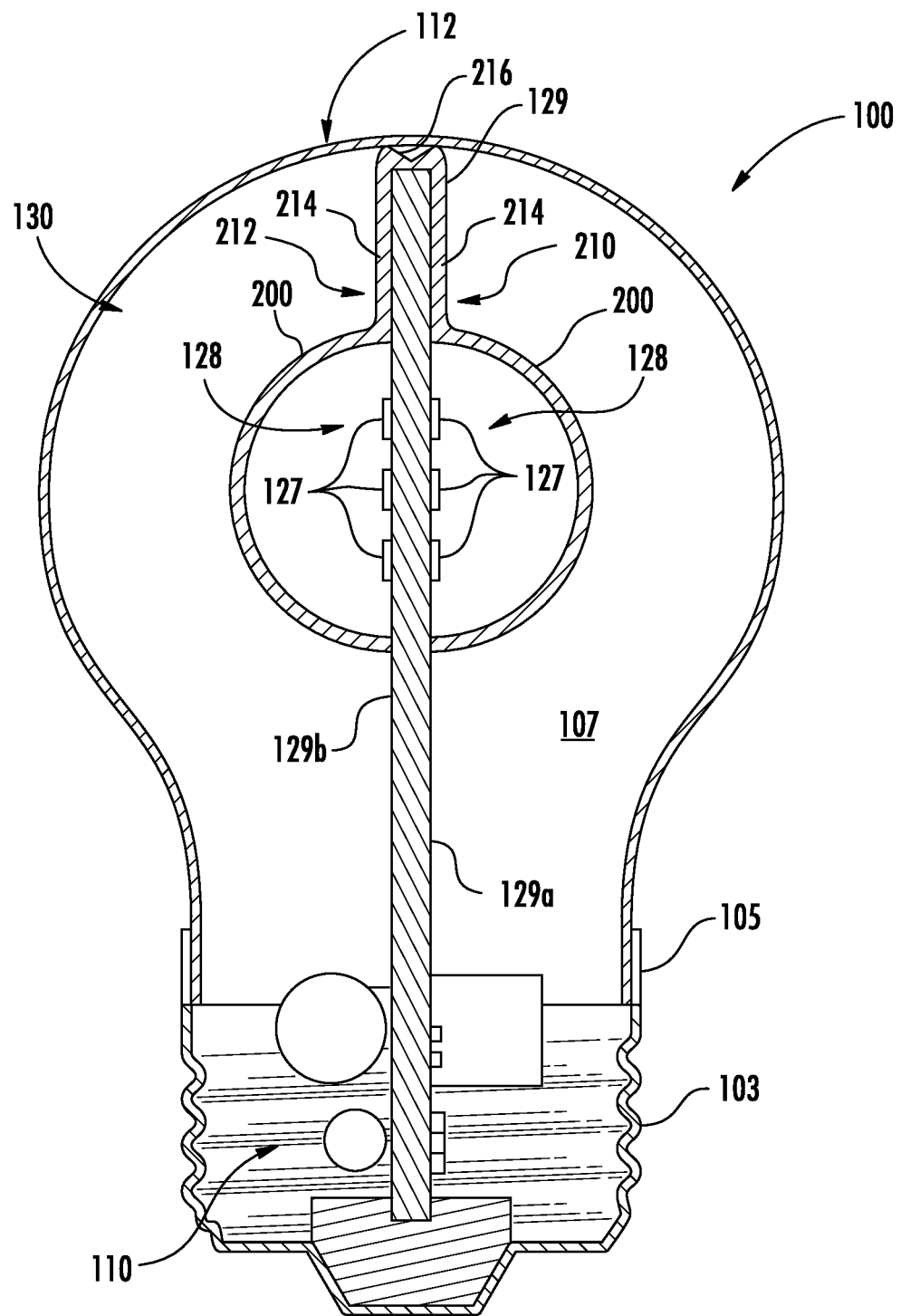
FIG. 6 is a section view of another embodiment of the lamp of the invention.
Figure 16:
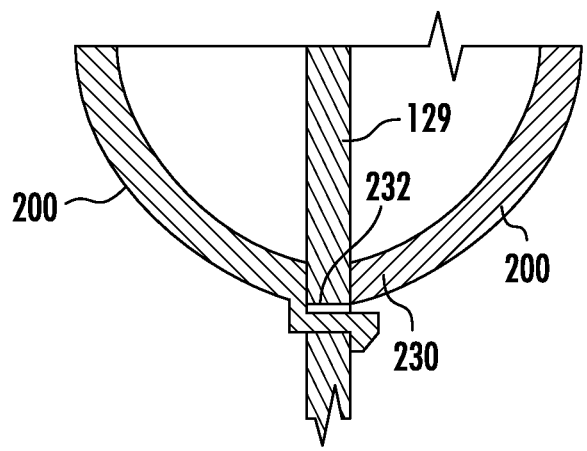
FIGS. 16-18 are partial section views showing alternate embodiments of the mating engagement structures for mounting the lens assembly to the LED board.
Figure 17:
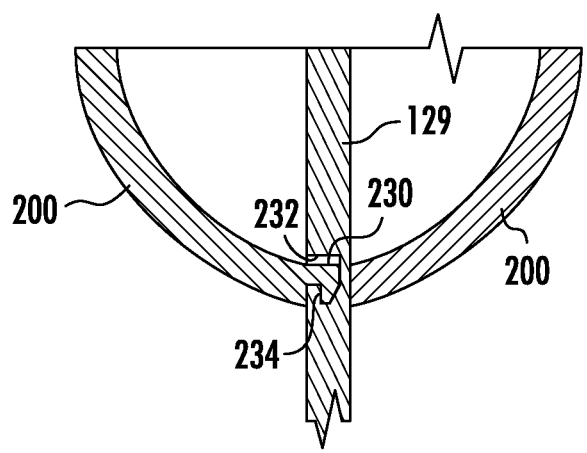
Figure 18:
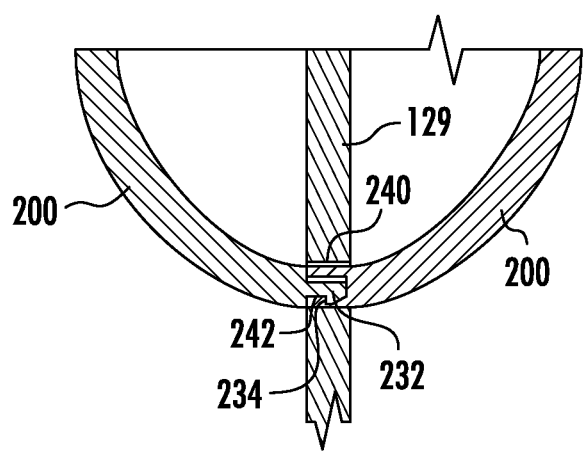

In one embodiment two separate lenses 200 may be used each attached to one side 129a, 129b of the LED board 129 such that the lens surrounds the LEDs mounted on that side of the board and diffuses the light generated by the LEDs as shown in FIGS. 4 and 5. The lenses 200 may be mounted to the LED board 129 in any suitable manner including adhesive, separate fasteners, a snap-fit connection or the like. In one embodiment the lenses 200 form part of a single lens assembly 210 as shown in FIGS. 6 and 8. In FIGS. 6 and 8 the lens assembly 210 has a clam shell construction where the lenses 200 are connected by a support assembly 212 that may comprise a support 214 extending from each lens 200 and connected at a living hinge 216. The living hinge 216 may be formed as a thinned area of the support assembly 212 that allows the material of the lens assembly 210 to bend in a clam shell like fashion to form a U-shaped support. The lens assembly 210 may be molded from plastic as a single, unitary piece. In some embodiments the lens assembly 210 may be made with the U-shape as shown in the figures where the lenses 200 are opposed to one another and connected by a U-shaped support that does not bend in a clam-shell manner but that may flex slightly to allow a board to be inserted between the lenses 200. The support assembly 212 is disposed over an edge of the LED board 129 such that the lenses 200 are disposed over and cover the LEDs 127 on each side of the LED board 129a, 129b. As previously described, the lens assembly 210 may be mounted to the LED board 129 in any suitable manner including adhesive, separate fasteners, a snap-fit connection of the like. In some embodiments the lenses 200 and/or support assembly 212 include male engagement members 230 such as deformable tangs formed along the periphery thereof that engaging a mating female engagement members 232 such as recesses formed in the LED board 129 in a snap-fit connection. In one embodiment the recesses 232 may be formed in the LED board 129 such that the tangs engage a mating locking surface formed on the LED board as shown in FIGS. 16 and 17. In FIG. 16 the tangs 230 extend through an aperture 232 in the LED board 129 and engage the opposite outside surface of the LED board 129 while in FIG. 17 the tangs 230 engage an internal surface 234 formed in recess 232 in the LED board 129. In some embodiments, the mating engagement structures may be reversed where the LED board 129 may be formed with the male engagement structure and the lens 200 and/or lens assembly 212 may be formed with mating female engagement structure. In other embodiments, the male engagement structures and the female engagement structures may both be formed on the lenses and/or lens assembly 210 as shown in FIG. 18. In one embodiment, the LED board 129 may be formed with apertures 240 through which the mating male engagement structures 232 and/or female engagement structures 242 extend that engage the opposed mating engagement structures formed on the second lens or the opposite side of the lens assembly. The engagement structures may comprise a flexible tang 232 that engages a surface 234 in recess 242 with a snap-fit connection to lock the lenses 200 or the opposite sides of the lens assembly 212 to one another with the LED board 129 trapped therebetween. In some embodiments combinations of connection mechanisms may be used.

Figure 7:
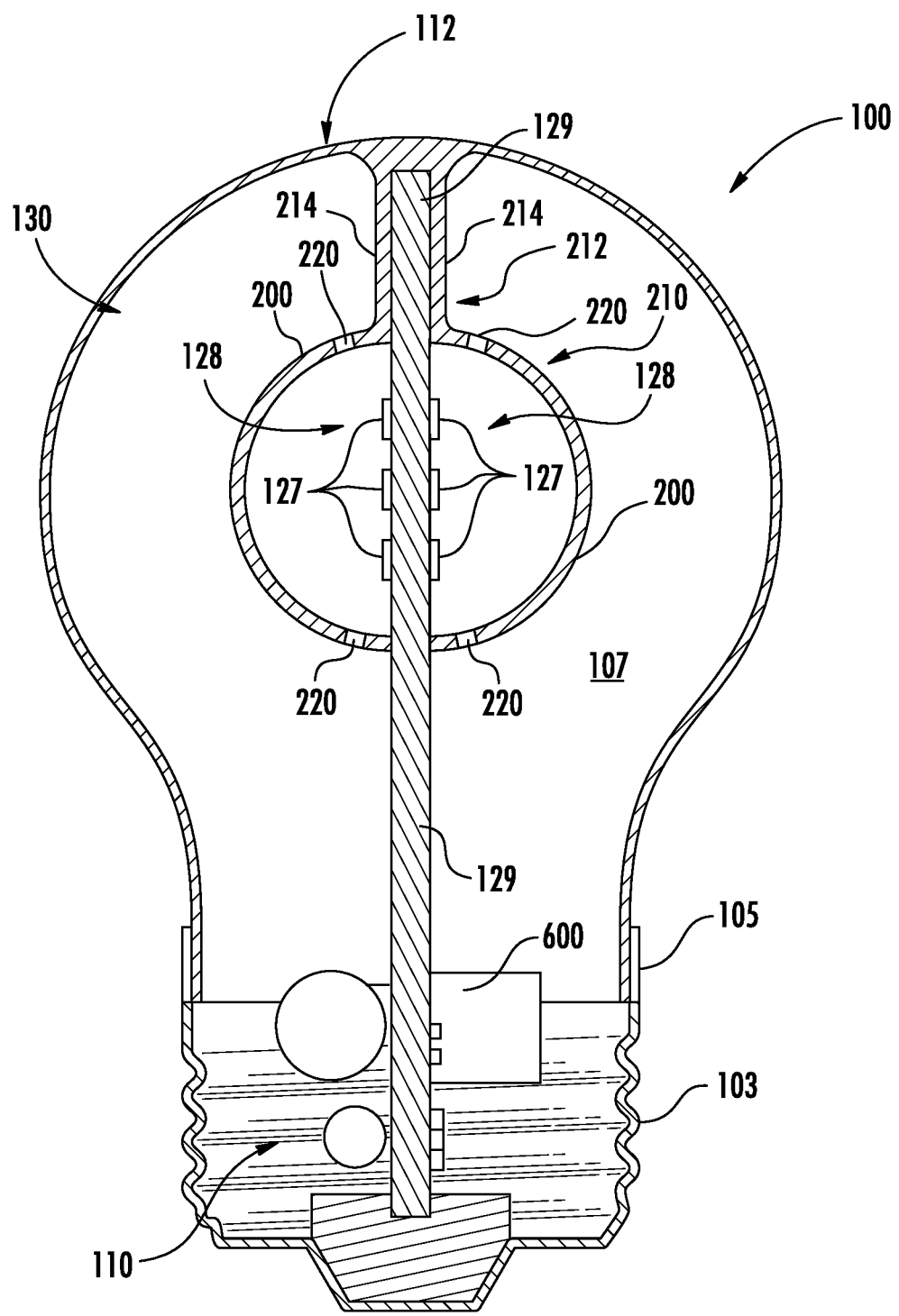
FIG. 7 is a section view of still another embodiment of the lamp of the invention.

While the lens assembly 210 is described as a separate element that is attached to the LED board 129 the lens assembly 210 may form part of the enclosure 112 as shown for example in FIG. 7. The support assembly 212 may be molded or otherwise formed as one-piece with the enclosure 112. For example, one-half of the lens assembly 210 may be molded with the one half of the enclosure 112R and the other half of the lens assembly 210 may be molded with the other half of the enclosure 112L such that when the enclosure parts 112R and 112L are joined together the LED board 129 is trapped between the lenses 200. A lens assembly made as an integral part of the enclosure 112 may be attached to the LED board 129 as described above.

Because the LED board is used as the heat dissipation element for dissipating heat from the LEDs 127 to the air flowing through the enclosure 112 via apertures 108 and 109 it may be preferable to make the lenses 200 relatively small compared to the surface area of the LED board 129 such that the LED board 129 extends beyond the lenses 200 and the air flowing in the enclosure 112 may contact as much of the LED board 129 as possible. By leaving a major portion of the LED board 129 exposed to the air flow, heat transfer from the LED board 129 to the air flowing in the enclosure is maximized. In some embodiments, vent openings 220 may be provided on the lenses 200 that allow air to flow into the space bounded by the lenses 200 such that the LEDs 127 and the portion of the LED board 129 covered by the lenses 200 are exposed to the air flowing through the enclosure 112. The vent openings 220 may be formed at the top end and the bottom end of the lenses 200 such that air may flow along the longitudinal axis A-A between the vent openings through the lenses. The vent openings 220 are made relatively small such that the vent openings do no present bright spots visible from the exterior of enclosure 112.

In some embodiments a wireless module 600 may be provided in the bulb for receiving, and/or transmitting, a radio signal or other wireless signal between the lamp and a control system and/or between lamps. The wireless module 600 may convert the radio wave to an electronic signal that may be delivered to the lamp electronics 110 for controlling operation of the lamp. The wireless module may also be used to transmit a signal from the lamp. The wireless module 600 may be positioned inside of the enclosure 112 such that the base 103 does not interfere with signals received by or emitted from wireless module 600. While the wireless module is shown in the enclosure 112, the wireless module may also extend entirely or partially outside of the lamp.

Although specific embodiments have been shown and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A lamp comprising:
an optically transmissive diffusive enclosure having a first end and a distal end spaced from the first end, the enclosure defining an interior space and a pair of first openings and a pair of second openings, the pair of first openings and the pair of second openings communicating the interior space with the exterior of the enclosure, the enclosure having an interior surface defining an interior shape;
a base connected to the first end of the enclosure;
a LED board positioned in the interior space and defining a first side and a second side where the first side is spaced from the enclosure by a first space and the second side is spaced from the enclosure by a second space and where the pair of first openings communicate with at least the first space and the pair of second openings communicate with at least the second space, the LED board having a first peripheral edge and a second peripheral edge extending from approximate the base toward the distal end of the enclosure, the LED board being dimensioned and shaped such that the first peripheral edge and the second peripheral edge of the LED board have the same shape as the interior shape of the interior surface such that the first peripheral edge and the second peripheral edge are disposed closely adjacent to the interior surface over the length of the first peripheral edge and the second peripheral edge;
at least one first LED mounted on the first side and at least one second LED mounted on the second side operable to emit light when energized through an electrical path from the base;
a first diffusive lens and a second diffusive lens located inside of and spaced from the enclosure, the first diffusive lens being spaced from the at least one first LED to define a first open space bounded by the first diffusive lens, the first diffusive lens receiving light emitted from the at least one first LED, and the second diffusive lens being spaced from the at least one second LED to define a second open space bounded by the second diffusive lens, the second diffusive lens receiving light emitted from the at least one second LED, the first diffusive lens and the second diffusive lens being mounted on the LED board such that a major portion of the LED board is exposed;
a thermally conductive area formed on the LED board for dissipating heat from the at least one first LED and the at least one second LED where at least a portion of the thermally conductive area is in the electrical path.

2. The lamp of claim 1 wherein the LED board comprises a PCB FR4 board.

3. The lamp of claim 1 wherein the LED board comprises a metal core printed circuit board.

4. The lamp of claim 1 wherein the thermally conductive area dissipates heat from the at least one first LED and the at least one second LED without a heat sink.

5. The lamp of claim 1 wherein the LED board comprises an electrical circuit mounted on a substrate.

6. The lamp of claim 5 wherein the substrate is not in the electrical path.

7. The lamp of claim 5 wherein the electrical circuit comprises at least one of a flex circuit and a lead frame and the substrate comprises at least one of glass and metal.

8. The lamp of claim 1 wherein a first one of the first pair of openings and a first one of the second pair of openings are provided proximate to the base and a second one of the first pair of openings and a second one of the second pair of openings are provided proximate to a distal end of the lamp such that air flows through the enclosure along a longitudinal axis of the lamp.

9. The lamp of claim 8 wherein the first diffusive lens and the second diffusive lens comprise vent openings that allow air to flow into the space bounded by the first diffusive lens and the second diffusive lens.

10. The lamp of claim 1 wherein the LED board comprises a planar rigid member.

11. The lamp of claim 10 wherein the first diffusive lens and the second diffusive lens are mounted to the LED board.

12. The lamp of claim 1 wherein the first diffusive lens and the second diffusive lens provide a diffuse scattering layer that produces a more uniform far field pattern.

13. The lamp of claim 1 wherein the first diffusive lens and the second diffusive lens form part of a single lens assembly having a U-shaped support that is disposed over the peripheral edge of the LED board, the U-shaped support comprising a first support member connected to the first diffusive lens and a second support member connected to the second diffusive lens where the first support member contacts the first side and the second support member contacts the second side.

14. The lamp of claim 13 wherein the first support member and the second support member are connected at a living hinge.

15. The lamp of claim 1 wherein the first diffusive lens and the second diffusive lens are connected to the LED board by a snap-fit connection.

16. The lamp of claim 1 wherein the first diffusive lens and the second diffusive lens are formed integrally with and are supported by the enclosure.

17. A lamp comprising:
an optically transmissive diffusive enclosure defining an interior space, the enclosure comprising apertures that allow air to flow into, through and out of the enclosure;
a base connected to the enclosure to define a longitudinal axis extending from the base to the enclosure;
a LED board positioned in the interior space and extending parallel to the longitudinal axis;
a plurality of LEDs mounted on the LED board operable to emit light when energized through an electrical path from the base;
a thermally conductive area formed on the LED board for dissipating heat from the plurality of LEDs where at least a portion of the thermally conductive area is in the electrical path a diffusive lens located inside of and spaced from the enclosure, the diffusive lens being spaced from the plurality of LEDs to define an open space bounded by the diffusive lens and the LED board, the diffusive lens receiving light emitted from the plurality of LEDs, the diffusive lens being mounted on the LED board such that a major portion of the LED board is exposed and wherein the diffusive lens comprises vent openings that allow the air to flow into the space bounded by the diffusive lens and the LED board, the diffusive lens being configured such that a first portion of the thermally conductive area is disposed inside of the diffusive lens and a second portion of the thermally conductive area is disposed outside of the diffusive lens.

\* \* \* \* \*